US005939982A

United States Patent [19]

Gagnon et al.

[11] Patent Number: 5,939,982

[45] Date of Patent: Aug. 17, 1999

[54] APPARATUS FOR MONITORING OPENING OF SEALED CONTAINERS

[75] Inventors: André Gagnon; Christian Tremblay, both of Quebec, Canada

[73] Assignee: Auratek Security Inc., Hull, Quebec, Canada

[21] Appl. No.: 09/092,854

[22] Filed: Jun. 8, 1998

[30] Foreign Application Priority Data

Jun. 9, 1997 [CA] Canada .................................. 2207231

[51] Int. Cl.[6] .............................. G08B 1/08; G01R 27/28

[52] U.S. Cl. ....................... 340/539; 340/545.6; 340/552; 340/545.1; 455/156.1; 455/227; 324/627

[58] Field of Search .................................... 340/539, 551, 340/545.6, 545.1, 552–554; 455/134, 152.1, 156.1, 154.1, 154.2, 227, 228, 229, 226.1; 324/627

[56] References Cited

U.S. PATENT DOCUMENTS

| | | | |
|---|---|---|---|
| 3,961,323 | 6/1976 | Hartkorn | 340/539 |
| 5,475,362 | 12/1995 | McRae | 340/426 |
| 5,615,247 | 3/1997 | Mills | 379/58 |
| 5,729,199 | 3/1998 | Cooper et al. | 340/539 |
| 5,828,220 | 10/1998 | Carney et al. | 324/627 |

*Primary Examiner*—Donnie L. Crosland
*Attorney, Agent, or Firm*—Thomas Adams

[57] ABSTRACT

Apparatus for monitoring opening of sealed enclosures, especially, but not exclusively, sealed containers containing goods-in-transit, such as goods vehicles, maritime containers or transport containers of the kind carried by tractor-trailers, ships, trains or aeroplanes comprises a radio receiver unit having at least one antenna for reception of radio signals. The receiver unit is housed within the enclosure and operates to scan a predetermined band of radio frequencies, periodically or continuously, and detect a sudden change in signal level. When it detects such a change in radio signal level, the receiver generates an alarm signal. Alternatively, the receiver may detect the difference between internal and external radio signal levels and determine the container to have been opened if the difference is less than a preset threshold. The receiver unit may be arranged to capture the FM frequency spectrum pertaining when the opening occurred and store it for later comparison with known FM frequency spectra of various cities to identify the location of the enclosure when opening occurred.

18 Claims, 1 Drawing Sheet

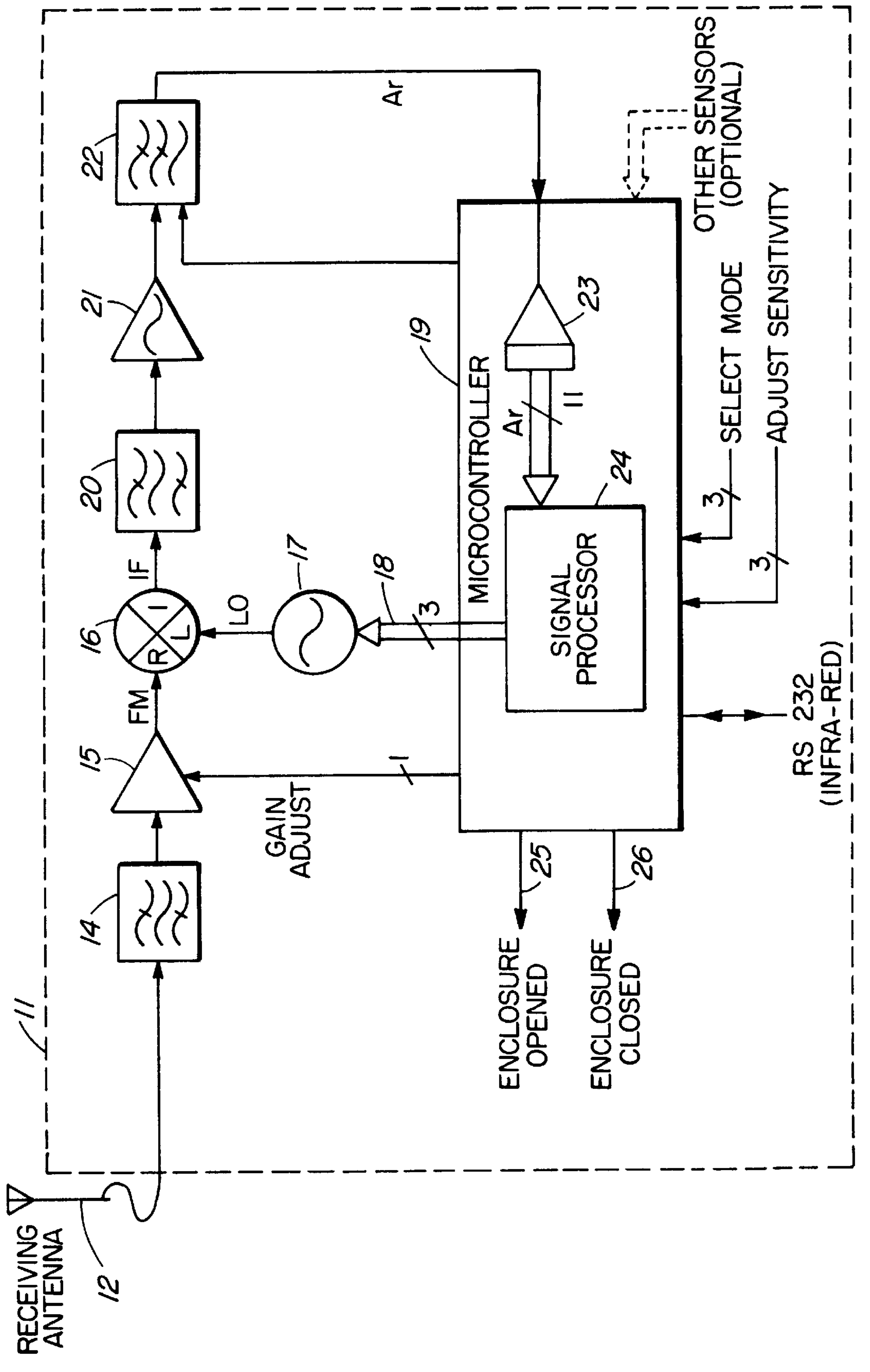
RECEIVING ANTENNA
12
11
14
15
GAIN ADJUST
FM
16
R
I
L
IF
LO
17
18
3
20
21
22
Ar
19
MICROCONTROLLER
23
Ar
11
24
SIGNAL PROCESSOR
1
25
26
ENCLOSURE OPENED
ENCLOSURE CLOSED
OTHER SENSORS (OPTIONAL)
SELECT MODE
ADJUST SENSITIVITY
RS 232 (INFRA-RED)

APPARATUS FOR MONITORING OPENING OF SEALED CONTAINERS

TECHNICAL FIELD

The invention relates to apparatus for monitoring opening of sealed containers and is especially, but not exclusively, concerned with monitoring for unauthorized access to vaults, safes, strongboxes, and sealed containers for goods-in-transit, such as goods vehicles, box trailers or shipping/transport containers of the kind carried by tractor-trailers, trains, aeroplanes or ships.

BACKGROUND ART

As a result of introducing so-called "Just-in-Time" manufacturing systems, and "Inventory-on-wheels" systems which use global positioning systems (GPS), many companies now have more products in transit than in their warehouses. Consequently, thefts of and from tractor-trailers, shipping containers and the like are increasingly a major security problem.

Security devices for tractor-trailers and transportation containers are known. For example, U.S. Pat. No. 5,475,362 discloses an alarm system for tractor-trailers which employs sensing switches which trigger the alarm when actuated, such as by the unauthorized opening of a door, and may also disable the vehicle. U.S. Pat. No. 5,615,247 discloses a security device for cargo transport containers which employs a pair of cables threaded through the door handles of the container. If the cables are cut or disconnected, the security device uses a cellular radio network to send an alarm signal to a security company. A disadvantage of these arrangements is that they protect only against conventional access, such as through doors, and are visible from inside or outside the container.

For one aspect of the present invention, an object is to mitigate this problem and provide a security device for sealed enclosures or containers which is capable of detecting access by any route. For another aspect of the invention, an object is to provide covert apparatus for monitoring opening of sealed enclosures.

DISCLOSURE OF INVENTION

According to one aspect of the present invention, apparatus for monitoring opening of an electromagnetically shielded enclosure, such as a shipping container, box trailer, vault, and so on, comprises a radio receiver unit having at least one antenna for reception of radio signals, the receiver unit to be housed within the enclosure and comprising means for scanning a predetermined band of radio frequencies, periodically or continuously, and detecting a predetermined radio signal level; and means operable in dependence upon such radio signal level detection to generate a signal indicating opening of the enclosure.

The receiver may detect the predetermined radio signal level by determining that the signal energy in the predetermined band inside the enclosure increased abruptly to exceed a preset reference level.

Alternatively, the receiver may detect the radio signal as a difference between internal and external radio signal levels.

Trailers and transport containers used for valuable products usually have metal panels, typically steel or aluminum, to make entry more difficult. Consequently, they are enclosures which are shielded against ingress of electromagnetic radiation (Faraday cages). Whether thieves steal the entire trailer or container, or break into it while it is parked or stored, at some point they will need to gain access to the contents by opening the door or cutting a hole in a side panel or roof panel, the latter approach sometimes being used when a trailer has been parked with its rear door against a wall. When this happens, electromagnetic radiation enters the enclosure and is detected by the receiver unit.

The receiver unit may be connected to an antenna for transmitting an alarm signal to a remote location, conveniently by cellular telephone, radio or satellite communications, either directly or by way of an existing system with which the vehicle is equipped.

Determining when and where the theft occurred often is particularly difficult, since it is known for thieves to replace customs or other door seals. Shipping of a container from one country to another might entail transport by tractor-trailers, storage in customs depots, and transportation on board ship. If, upon arrival of the container at its destination, it is discovered that it has been opened and the contents stolen or tampered with, it is very difficult to determine where and when this occurred, which hampers investigations by police officers and may also affect insurance claims. Accordingly, the receiver may be provided with means for recording the times of all events involving opening or closing of the container, to provide a record for checking when the container reaches its destination.

Preferably, when an intrusion occurs, the receiver captures and stores the frequency spectrum. Each city has its own particular FM frequency spectrum so the captured spectrum can be compared with known city spectra to identify the city in which the or each intrusion took place.

The receiver may also include means for activating a local audible and/or visual alarm, such as a siren, vehicle horn, vehicle lights, and so on. In some cases, however, it may be preferable to record the opening/closing of the enclosure without generating an alarm.

Where the enclosure is a trailer of a tractor-trailer unit or other vehicle equipped with a transmitter for use with a global positioning system (GPS), the receiver unit may comprise means for interfacing to the GPS receiver to provide a record of the location of the container at the time it was opened.

Preferably, the monitoring apparatus is not readily apparent to a potential intruder. The apparatus may be hidden from view or camouflaged. Many shipping containers and the like have door seals which comprise a tubular seal of rubber or other flexible material. According to another aspect of the invention for use with such containers the antenna is filamentary, conveniently a length of leaky cable (open transmission line) and is disposed inside the tubular door seal. The receiver unit itself may be housed in a slim cylindrical housing and also disposed inside the door seal.

An advantage of disposing the antenna inside the door seal is that the close proximity to the metal of the door and/or surrounding end wall effectively short-circuits the antenna and hence the radio receiver signal when the door is closed.

Alternatively, the antenna or/and receiver unit may be camouflaged as a reinforcing strip or other feature of the container interior.

According to another aspect of the invention, a method of monitoring for opening of an electromagnetically shielded enclosure using a radio receiver unit having at least one antenna for reception of radio frequency signals, includes the steps of housing the receiver unit within the enclosure, operating the receiver unit to scan a predetermined band of radio frequencies, periodically or continuously, detecting a predetermined radio signal level; and, in dependence upon such radio signal level detection, generating a signal indicating opening of the enclosure.

Preferred embodiments of the invention will now be described, by way of example only, with reference to the accompanying drawing.

BRIEF DESCRIPTION OF THE DRAWING

The attached drawing is a block schematic diagram of the monitoring apparatus including a scanning FM receiver unit shown in more detail.

DETAILED DESCRIPTION OF PREFERRED EMBODIMENTS

An electromagnetically-shielded enclosure, which could be a shipping container or the box trailer of a tractor-trailer vehicle, houses an electromagnetic field disturbances volumetric sensor comprising a radio receiver unit which is connected to an antenna. The antenna comprises a leaky cable located around the door of the container, housed within a door seal. Preferably, the radio receiver unit is capable of operating throughout the broadcast FM radio band from 88 MHz. to 108 MHz.

Referring to the drawing, in the receiver unit 11, the radio frequency signal received from the associated antenna 12 is coupled to a bandpass filter 14 which restricts the radio signal to the FM spectrum from 88 MHz. to 108 MHz. and passes it to a low noise amplifier 15. The amplified signal from amplifier 15 is down-converted to an intermediate frequency (IF) signal of 10.7 MHz. by a mixer 16 which derives its local oscillator signal (LO) from a phase-locked loop oscillator (PLO) 17. The PLO 17 is controlled, via bus 18, by a microcontroller 19 which causes the local oscillator frequency to scan the spectrum in steps of 200 kHz. which is the usual spacing between FM radio stations.

The microcontroller 19 monitors continuously the signal strength inside the enclosure. For each frequency step, the down-converted IF signal from mixer 16 is filtered by a second bandpass filter 20 having a bandwidth of 300 kHz. centered upon the IF frequency. The magnitude of the output from second bandpass filter 20 is measured using a logarithmic amplifier 21. The analog signal from the logarithmic amplifier 21 represents the amplitude of the radio frequency signal for a selected station and is filtered by a low pass filter 22 having a cut-off of 80 Hz. The filtered signal Ar from low pass filter 22 is converted to an eleven bit digital signal by analog-to-digital (A-to-D) converter 23 within the microcontroller 19. The digital signal from A-to-D converter 23 is processed by a signal processor 24 of the microcontroller 19. D.C. power for the receiver is provided from an internal battery.

The microprocessor 19 causes the receiver to scan the FM radio band continuously. During each scan, the microcontroller 19 accumulates the power levels detected at each frequency step, (as derived from the signals from the A–D converter 23) and calculates the total accumulated power or energy of the received signals in the band for each 200 kHz. increment in frequency. The microcontroller 19 compares this energy level with a preset reference level and also compares the time in which the signal increased. If the signal energy increased to greater than the threshold within a predetermined time, e.g. 0.5 seconds, the microcontroller 19 generates an “Enclosure opened” ALARM signal on line 25. The preset reference level is set so that, so long as the container has not been opened, it will be greater than the signal level inside the enclosure. Conversely, when the energy level returns to its previous value, i.e. that prevailing before the container was opened, the microcontroller 19 will generate an “Enclosure closed” signal on line 26.

The reason the microcontroller also determines the rate at which the signal level changed is that a sudden change occurring, say, in 0.5 seconds, implies opening of the container whereas a more gradual change may result from a change in the environment or location of the closed container. The microcontroller 19 will also determine that the signal strength has remained above the threshold for a predetermined length of time, to avoid recording as an “event”, e.g. unauthorized opening, a brief disturbance of the signal level without opening of the enclosure.

The user may adjust the threshold, and hence the sensitivity, by means of control line “Adjust sensitivity”. In addition, the user may select on of three modes of operation “Record On-event”, “Record Continuously” or “Record On-event and Continuously”.

The apparatus will be provided with outputs for indicating events such as opening and closing of the enclosure and tampering with or failure of the monitoring apparatus, and battery condition. The microcontroller 19 is shown with an RS 232 port enabling such data to be transferred, conveniently by means of an infra-red coupling to enable the data to be downloaded and the apparatus reconfigured by means of such a laptop computer equipped with an infra-red I/O interface.

Various modifications are feasible within the scope of the present invention. Thus, the receiver 11 may be arranged to capture the FM spectrum prevailing when the intrusion occurred. In particular, the microcontroller 19 may be programmed to capture the spectrum and store it in the memory of the signal processor 24. Each city has its own particular FM frequency spectrum. When subsequently an intrusion is being investigated, the captured frequency spectrum can be compared with known spectra for different cities to identify the city in which the or each intrusion took place. This information is crucial to locating the intrusion site and allocating shipper responsibility.

The monitoring apparatus could comprise two antennas, one inside and the other outside the enclosure enabling the receiver to monitor the signal levels inside and outside the enclosure, determine the difference between them, and indicate opening of the enclosure whenever the difference is less than a preset reference.

If cost and simplicity warrant it, a simpler, analog embodiment could be employed, using an analog sample-and-hold circuit connected to a comparator, for example a Schmidt trigger, for comparing the output of the sample-and-hold circuit with a preset reference voltage. The reference voltage would be set so that, so long as the container was closed, and the electromagnetic shielding intact, it would not be exceeded by the output of the sample-and-hold circuit yet, as soon as the enclosure was opened, the increase in the radio signal level inside the enclosure would cause the output of the sample-and-hold circuit to exceed the reference. When that happened, the comparator would generate an alarm signal.

It should be appreciated that other types of radio receiver could be employed instead of an FM radio receiver, monitoring for example AM bands, cellular telephone bands, LORAN-C (trademark) or even cosmic/manmade noise. The antenna would be selected to suit. For example, a loop antenna might be provided around a door, a short dipole might be hidden within a package, a ported coaxial cable might be disposed along a long wall. Although, in the described embodiment, the antenna is shown separate from the receiver unit, it could be integrated into it.

It should be appreciated that, although the specific implementation described herein is for a shipping container, the invention is not limited to shipping containers or tractor-trailers. Rather, the invention could be applied to any enclosure which is shielded against ingress of electromagnetic radiation, whether made of shielding material, such as a metal trailer, steel-lined bank vault, metal barrel, steel cabinet or safe, and so on, or very thick concrete, such as a bank vault, or made from a material which does not itself provide shielding but which is lined with a suitable screening mesh or film which comprises the shield.

Although the specific embodiment has been described with reference to unauthorized access to shipping containers, it should be appreciated that embodiments of the invention may be used for monitoring containers carrying toxic or radioactive materials. Although the apparatus primarily monitors for unauthorized opening of the enclosure, it would be possible to add other sensors to sense temperature, pressure, acceleration, earth magnetic field (e.g. for orientation) and so on and have the microcontroller monitor those also by way of suitable additional I/O interfaces.

It is envisaged that there might be locations, such as in the middle of the ocean, where reception of normal FM or other radio signals is very poor. In order to ensure proper operation of the monitoring apparatus in such conditions, the carrier may use a low power transmitter, for example on board the ship, to radiate a suitable signal continuously and ensure that the monitoring apparatus will always be able to detect a change in the signal strength when the container is opened.

What is claimed is:

1. Apparatus for monitoring opening of an electromagnetically shielded enclosure, comprising a radio receiver unit having at least one antenna for reception of radio signals, the receiver unit to be housed within the enclosure and comprising means for scanning a predetermined band of radio frequencies, periodically or continuously, and detecting a predetermined radio signal level; and means operable in dependence upon such radio signal level detection to generate a signal indicating opening of the enclosure.

2. Apparatus according to claim 1, wherein the receiver detects the predetermined radio signal level by determining that the signal energy in the predetermined band inside the enclosure increased abruptly to exceed a preset reference level.

3. Apparatus according to claim 1, wherein the receiver detects the radio signal as a difference between internal and external radio signal levels.

4. Apparatus according to claim 1, wherein the receiver unit is connected to an antenna for transmitting an alarm signal to a remote location.

5. Apparatus according to claim 4, further comprising a communications unit for transmitting the alarm signal to the remote location, the communications unit comprising a cellular telephone unit, a radio or a satellite communications device.

6. Apparatus according to claim 4, further comprising an interface for communicating with a communications device with which the vehicle is equipped, the communications device comprising a cellular telephone unit, a radio or a satellite communications device.

7. Apparatus according to claim 1, further comprising means for activating a local audible and/or visual alarm.

8. Apparatus according to claim 1, further comprising means for recording the opening/closing of the enclosure without generating an alarm.

9. Apparatus according to claim 1, for an enclosure of a vehicle equipped with a transmitter/receiver for use with a global positioning system (GPS), the receiver unit comprising means for interfacing to the GPS receiver to provide a record of the location of the container at the time it was opened.

10. Apparatus according to claim 1, at least part of which is camouflaged or otherwise hidden from the view of a potential intruder.

11. Apparatus according to claim 10, for use with an enclosure having door seals which comprise a tubular seal of rubber or other flexible material, wherein the antenna is filamentary so as to fit inside said door seal.

12. Apparatus according to claim 11, wherein the antenna comprises a length of leaky cable transmission line.

13. Apparatus according to claim 11, wherein the receiver unit is housed in a slim cylindrical housing and disposed inside the door seal.

14. Apparatus according to claim 12, wherein the receiver unit is housed in a slim cylindrical housing and disposed inside the door seal.

15. Apparatus according to claim 10, wherein one or both of the antenna and receiver are camouflaged as a reinforcing strip or other feature of the container interior.

16. Apparatus according to claim 1, wherein the receiver unit comprises means operable in dependence upon detection of opening of the enclosure to store the FM frequency spectrum pertaining when opening occurred.

17. A method of monitoring for opening of an electromagnetically shielded enclosure using a radio receiver unit having at least one antenna for reception of radio frequency signals, including the steps of housing the receiver unit within the enclosure, operating the receiver unit to scan a predetermined band of radio frequencies, periodically or continuously, and detecting a predetermined radio signal level; and, in dependence upon such radio signal level detection, generating a signal indicating opening of the enclosure.

18. A method according to claim 17, further comprising the step of capturing and storing the FM frequency spectrum pertaining when each opening of the enclosure was detected.

* * * * *